(12) United States Patent
Hase et al.

(10) Patent No.: US 11,677,358 B2
(45) Date of Patent: Jun. 13, 2023

(54) POWER AMPLIFIER CIRCUIT

(71) Applicant: Murata Manufacturing Co., Ltd., Kyoto (JP)

(72) Inventors: Masatoshi Hase, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 224 days.

(21) Appl. No.: 16/783,373

(22) Filed: Feb. 6, 2020

(65) Prior Publication Data
US 2020/0259468 A1 Aug. 13, 2020

(30) Foreign Application Priority Data

Feb. 7, 2019 (JP) .............................. JP2019-020475

(51) Int. Cl.
*H03F 1/56* (2006.01)
*H03F 3/213* (2006.01)
*H05K 1/02* (2006.01)

(52) U.S. Cl.
CPC .............. *H03F 1/56* (2013.01); *H03F 3/213* (2013.01); *H05K 1/0243* (2013.01); *H03F 2200/222* (2013.01); *H03F 2200/387* (2013.01); *H03F 2200/451* (2013.01); *H05K 2201/10674* (2013.01)

(58) Field of Classification Search
CPC ...... H03F 1/56; H03F 3/213; H03F 2200/222; H03F 2200/387; H03F 2200/451; H05K 1/0243; H05K 2201/10674

USPC ........................................................ 330/297
See application file for complete search history.

(56) References Cited

U.S. PATENT DOCUMENTS

| 8,686,537 | B2 | 4/2014 | Sun et al. |
| 2003/0076174 | A1 | 4/2003 | Tanoue et al. |
| 2015/0365057 | A1* | 12/2015 | Kaczman ................ H03F 1/025 330/296 |

(Continued)

OTHER PUBLICATIONS

Section 12.3: Grounding, Chapter 12: Printed Circuit Board (PCB) Design Issues, Linear Circuit Design Handbook, 2008, Analog Devices, Inc. (Year: 2008).*

(Continued)

*Primary Examiner* — Hafizur Rahman
(74) *Attorney, Agent, or Firm* — Pearne & Gordon LLP

(57) ABSTRACT

A power amplifier circuit includes a substrate and a semiconductor chip disposed on or above the substrate. The semiconductor chip includes a power amplifier unit that amplifies an RF signal, a ground terminal to which a ground of the power amplifier unit is coupled, and a first circuit element having a first end electrically coupled to the ground terminal without any portion outside the semiconductor chip interposed therebetween, and having a second end. The substrate includes a second circuit element having a first end electrically coupled to an output of the power amplifier unit and a second end electrically coupled to the second end of the first circuit element. The first and second circuit elements constitute a harmonic wave termination circuit. The harmonic wave termination circuit reflects, to the power amplifier unit, a harmonic wave component of the amplified RF signal output from the power amplifier unit.

16 Claims, 3 Drawing Sheets

(56) References Cited

U.S. PATENT DOCUMENTS

2018/0226922 A1* 8/2018 Hase .................... H03F 1/0211

OTHER PUBLICATIONS

John Priday, Thermal Management in High Performance RF and Microwave PCBs Teradyne Defense Electronics, Application Note, Aug. 2018. (Year: 2018).*
Proto Electronics, Our 8 best hints for RF PCB design, https://www.proto-electronics.com/blog/pcb-design-hints-rf-pcb. (Year: 2022).*
Avago Technologies, AN 5052, Copyright © 2005-201 OAvago Technologies. 5989-0826EN—Aug. 3, 2010 (Year: 2010).*
Michael Bailey, "General Layout Guidelines for RF and Mixed-Signal PCBs", Maxim Integrated, Tutorial 5100, Sep. 14, 2011. (Year: 2011).*
Ram Kandiar, "Wireless USBTM LR+PA Radio Module Layout Guidelines", AN6067, Cypress Perform, Dec. 31, 2010. (Year: 2010).*
Lead Definition from Wikipedia; https://en.wikipedia.org/wiki/Lead_(electronics) (Year: 2022).*
Printed Circuit Board Layout, FMB Informatica S.r.l., Via Gramsci, 7—36061 Bassano del Grappa (VI)—Italy, (Year: 2022).*
RFPA5542 WLAN Power Amplifier 5 GHz WLAN PA (11a/n/ac), Application Note: RFPA5542 WLAN Power Amplifier, Qorvo, Jan. 2018. (Year: 2018).*

\* cited by examiner

POWER AMPLIFIER CIRCUIT

This application claims priority from Japanese Patent Application No. 2019-020475 filed on Feb. 7, 2019. The content of this application is incorporated herein by reference in its entirety.

BACKGROUND

The present disclosure relates to a power amplifier circuit.

In communication using a radio frequency signal, a power amplifier circuit is used for amplifying the radio frequency signal. When amplifying a radio frequency signal, the power amplifier circuit is required to suppress harmonic wave components of the radio frequency signal.

U.S. Patent Application Publication No. 2003/0076174 discloses, as a power amplifier circuit, a high-frequency amplifier including a semiconductor chip including a transistor, an inductor, and capacitors; and a module substrate on which the semiconductor chip is disposed. The power amplifier circuit disclosed in U.S. Patent Application Publication No. 2003/0076174 includes a harmonic wave termination circuit constituted by integrated capacitors on the semiconductor chip, a lead coupling the semiconductor chip and the module substrate to each other and wiring on the module substrate.

The harmonic wave termination circuit included in the power amplifier circuit disclosed in U.S. Patent Application Publication No. 2003/0076174 is grounded as a result of being coupled to a ground of the module substrate. The ground of the module substrate is coupled to a ground of the semiconductor chip. The transistor included in the semiconductor chip refers to a reference potential of the semiconductor chip.

When the harmonic wave termination circuit is coupled to the ground of the module substrate, a current that is terminated to the ground by the harmonic wave termination circuit flows, as a return current, from the ground of the module substrate to the ground of the semiconductor chip.

This return current causes a reference potential of the module substrate to fluctuate. If the reference potential of the module substrate fluctuates, the performance of other circuits that refer to the reference potential of the module substrate deteriorates.

BRIEF SUMMARY

Accordingly, the present disclosure provides a power amplifier circuit capable of suppressing or reducing a fluctuation in a reference potential of a substrate.

According to embodiments of the present disclosure, a power amplifier circuit includes a substrate and a semiconductor chip disposed on or above the substrate. The semiconductor chip includes a power amplifier unit that amplifies a radio frequency signal, a first ground terminal to which a ground of the power amplifier unit is coupled, and a first circuit element having a first end and a second end. The first end is electrically coupled to the first ground terminal without necessarily any portion outside of the semiconductor chip interposed therebetween. The substrate includes a second circuit element having a first end and a second end. The first end is electrically coupled to an output of the power amplifier unit, and the second end is electrically coupled to the second end of the first circuit element. The first circuit element and the second circuit element form a part of a harmonic wave termination circuit. The harmonic wave termination circuit reflects, to the power amplifier unit, a harmonic wave component of the amplified signal output from the power amplifier unit.

According to embodiments of the present disclosure, a power amplifier circuit capable of suppressing or reducing a fluctuation in a reference potential of a substrate can be provided.

Other features, elements, characteristics and advantages of the present disclosure will become more apparent from the following detailed description of embodiments of the present disclosure with reference to the attached drawings.

DETAILED DESCRIPTION

Figure 1:
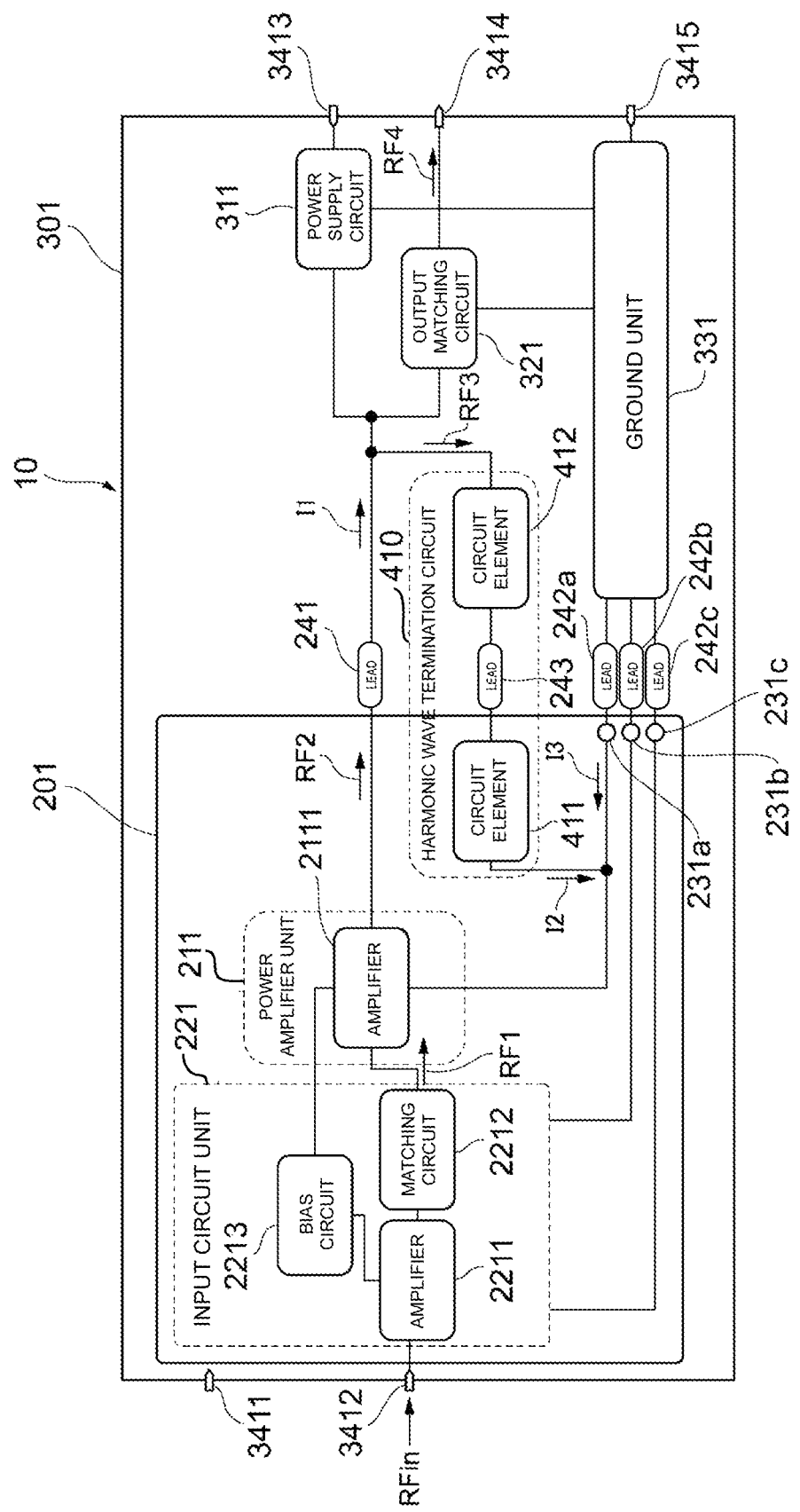
FIG. 1 is a block diagram of a power amplifier circuit according to a first embodiment of the present disclosure.

Embodiments of the present disclosure will be described in detail below with reference to the accompanying drawings. Note that the same or substantially the same components are denoted by the same reference numerals to omit repeated descriptions as much as possible.

A first embodiment will be described. As illustrated in FIG. 1, a power amplifier circuit 10 according to the first embodiment includes a semiconductor chip 201, a substrate 301, and a harmonic wave termination circuit 410.

The semiconductor chip 201 includes a power amplifier unit 211, an input circuit unit 221, ground terminals 231a, 231b, and 231c, at least a part of leads 241, 242a, 242b, 242c, and 243, and a circuit element 411.

The power amplifier unit 211 includes an amplifier 2111. The amplifier 2111 is an amplifier that amplifies power of a radio frequency (RF) signal and includes a transistor. The transistor is, for example, a bipolar transistor such as a heterojunction bipolar transistor (HBT), or a field-effect transistor such as a metal-oxide-semiconductor field-effect transistor (MOSFET).

The input circuit unit 221 includes an amplifier 2211, a matching circuit 2212, and a bias circuit 2213. The amplifier 2211 amplifies an RF signal input to the power amplifier circuit 10 and outputs the amplified RF signal to the power amplifier unit 211. The matching circuit 2212 is provided for achieving impedance matching between the amplifiers 2211 and 2111. The bias circuit 2213 is a circuit that supplies a bias current or voltage to the amplifiers 2211 and 2111.

The ground terminal 231a is coupled to a ground of the power amplifier unit 211. The ground terminals 231b and 231c are coupled to grounds of the input circuit unit 221.

The leads 241, 242a, 242b, 242c, and 243 are provided to couple the semiconductor chip 201 and the substrate 301 to each other. The semiconductor chip 201 and the substrate 301 may be coupled to each other, for example, by bumps in the case of flip chip bonding. The lead 241 couples the semiconductor chip 201 and the substrate 301 to each other. One end of the lead 243 is coupled to the circuit element 411, and the other end of the lead 243 is coupled to a circuit element 412. The circuit elements 411 and 412 will be described later. Note that the semiconductor chip 201 and the substrate 301 may be coupled to each other by wire bonding. In such a case, the leads may be replaced with wires.

One end of the lead 242a is coupled to the ground terminal 231a. One end of the lead 242b is coupled to the ground terminal 231b. One end of the lead 242c is coupled to the ground terminal 231c. The other end of each of the leads 242a, 242b, and 242c is coupled to a ground unit 331 (described later).

The circuit element 411 is a circuit element that forms a part of the harmonic wave termination circuit 410. Examples of the circuit element 411 include, for example, a capacitor and an inductor. One end of the circuit element 411 is coupled to the ground terminal 231a without necessarily any portion outside the semiconductor chip 201 interposed therebetween.

The substrate 301 includes a power supply circuit 311, an output matching circuit 321, the ground unit 331, the circuit element 412, input terminals 3411, 3412, and 3413, an output terminal 3414, and a ground terminal 3415. A control signal is input to the input terminal 3411. An RF signal is input to the input terminal 3412.

For example, a battery voltage is supplied to the power supply circuit 311, for example, via the input terminal 3413. The power supply circuit 311 is, for example, a high-frequency blocking circuit (RF choke circuit). The power supply circuit 311 includes at least one choke inductor to supply a DC bias to the power amplifier unit 211 and block a high-frequency output from flowing to the input terminal 3413 from the power amplifier unit 211. An envelope tracking (ET) power supply using a DC-DC converter, or a DC-DC converter power supply may be coupled to the power supply circuit 311 instead of the battery voltage.

The output matching circuit 321 is coupled to the output terminal 3414. The output matching circuit 321 is coupled to the amplifier 2111. The output matching circuit 321 is coupled to, for example, a collector terminal of the transistor of the amplifier 2111. The output matching circuit 321 achieves impedance matching between the amplifier 2111 and a circuit coupled to the output terminal 3414.

The ground unit 331 is a portion of the substrate 301 coupled to the ground terminal 3415. The ground unit 331 is supplied with a reference potential via the ground terminal 3415. The ground unit 331 supplies the reference potential to circuits coupled to the ground unit 331. The power supply circuit 311, the output matching circuit 321, and the ground terminals 231a, 231b, and 231c are coupled to the ground unit 331. In the embodiments of the present disclosure, the ground terminal 3415 of the substrate 301 is coupled to a ground of a motherboard (not illustrated).

One end of the circuit element 412 is coupled to the amplifier 2111 with the lead 241 interposed therebetween. Examples of the circuit element 412 include, for example, a capacitor and an inductor. The one end of the circuit element 412 is coupled to, for example, a collector terminal of the transistor of the amplifier 2111 with the lead 241 interposed therebetween. The other end of the circuit element 412 is coupled to the circuit element 411 with the lead 243 interposed therebetween.

The circuit elements 411 and 412 form a part of the harmonic wave termination circuit 410. The harmonic wave termination circuit 410 is provided to reflect, toward the power amplifier circuit 10, harmonic wave components (harmonic wave signals having frequencies that are integral multiples of the fundamental frequency) included in the RF signal amplified by the power amplifier circuit 10. Specifically, the harmonic wave termination circuit 410 has a relatively low impedance for a harmonic wave component (for example, a second harmonic wave component) included in the RF signal and terminates the harmonic wave component to the ground.

One of the circuit elements 411 and 412 of the harmonic wave termination circuit 410 is, for example, an inductor, and the other of the circuit elements 411 and 412 is, for example, a capacitor. An inductance component of the harmonic wave termination circuit 410 and an inductance component of wiring extending from the amplifier 2111 to the circuit element 412 are used to determine the impedance for harmonic wave termination. That is, the inductance component of the circuit element 412 includes the inductance component of the wiring of the substrate 301.

In the harmonic wave termination circuit 410, the inductance component of the inductor and the wiring and a capacitance component of the capacitor constitute an LC series resonance circuit. The harmonic wave termination circuit 410 causes impedance mismatching by making the impedance of the LC series resonance circuit low at frequencies of the harmonic wave components of interest, so that the harmonic wave components are not output to the output terminal 3414. More specifically, when impedance mismatching is caused by making the impedance low, the harmonic wave termination circuit 410 functions to reflect the harmonic wave components. The harmonic wave components reflected by the harmonic wave termination circuit 410 are combined with the harmonic wave components output from the power amplifier circuit 10 to generate a standing wave. In this way, the harmonic wave termination circuit 410 blocks the harmonic wave components from outputting to the output terminal 3414.

An operation of the power amplifier circuit 10 will be described. The description will be given of the case where an RF signal RFin is input to the power amplifier circuit 10 from the input terminal 3412. The input RF signal RFin is amplified by the amplifier 2211.

The RF signal RFin is converted into an RF signal RF1 as a result of being amplified. The RF signal RF1 is supplied to the power amplifier unit 211 from the amplifier 2211 via the matching circuit 2212. The RF signal RF1 is input to the amplifier 2111 in the power amplifier unit 211. For example, the RF signal RF1 is input to a base terminal of the transistor of the amplifier 2111.

The amplifier 2111 amplifies the RF signal RF1 and outputs an RF signal RF2 which is the amplified signal. The RF signal RF2 is output to outside of the semiconductor chip 201 via the lead 241.

A harmonic wave component RF3 (for example, a second harmonic wave component) included in the RF signal RF2 is terminated by the harmonic wave termination circuit 410. An RF signal RF4 in which the harmonic wave component is attenuated is output from the output terminal 3414 of the power amplifier circuit 10 via the output matching circuit 321.

An RF signal is transmitted as an electromagnetic wave that propagates through a transmission line. Now, an electromagnetic wave that is excited by a given signal source and propagates through a transmission line is considered. In such a case, it is known that a loop current originating from the signal source flows owing to a conduction current that is induced on a signal line by this electromagnetic wave and a return current that is induced on the ground in the opposite direction to that of the conduction current (see Ralph Morrison, "Grounding and Shielding: Circuits and Interference", Sixth edition, (US), Wiley-IEEE Press, March 2016). In the power amplifier circuit 10, a return current of a current I1 output from the power amplifier unit 211 corresponding to the signal source returns to the power amplifier unit 211 and the input circuit unit 221 via the ground of the semiconductor chip 201 or the ground unit 331 of the substrate 301.

The return current that returns to the power amplifier unit 211 includes a current I2 and a current I3. The current I2 is a loop current that flows from the power amplifier unit 211, flows through the harmonic wave termination circuit 410, and returns to the power amplifier unit 211, that is, a loop current flowing through a closed circuit. The current I3 is a loop current that flows from the power amplifier unit 211, flows through the output matching circuit 321 or the power supply circuit 311, the ground unit 331, and the ground terminal 231a, and returns to the power amplifier unit 211, that is, a loop current flowing through a closed circuit.

In the power amplifier circuit 10, the current I2 is greater in value than the current I3 and is a dominant return current. In the power amplifier circuit 10, the current I2 that is the dominant return current flows without necessarily flowing through the ground unit 331 of the substrate 301. Therefore, a fluctuation in the reference potential of the ground unit 331 is suppressed or reduced. The input circuit unit 221 is coupled to the ground unit 331 with the leads 242b and 242c and the ground terminals 231b and 231c interposed therebetween. Thus, suppression or reduction of the fluctuation in the reference potential results in suppression or reduction of a deterioration in the characteristics of the input circuit unit 221.

The power amplifier circuit 10 according to the first embodiment includes the substrate 301, and the semiconductor chip 201 disposed on or above the substrate 301. The semiconductor chip 201 includes the power amplifier unit 211 that amplifies an RF signal, the ground terminal 231a to which the ground of the power amplifier unit 211 is coupled, and the circuit element 411 having a first end and a second end. The first end is electrically coupled to the ground terminal 231a without necessarily any portion outside the semiconductor chip 201 interposed therebetween. The substrate 301 includes the circuit element 412 having a first end electrically coupled to the output of the power amplifier unit 211 and a second end electrically coupled to the second end of the circuit element 411. The circuit element 411 and the circuit element 412 form a part of the harmonic wave termination circuit 410. The harmonic wave termination circuit 410 reflects, to the power amplifier unit 211, the harmonic wave component RF3 of the RF signal RF2 that is an amplified signal output from the power amplifier unit 211. In other words, the harmonic wave termination circuit 410 causes the current I2 that is a return current of the harmonic wave component RF3 of the RF signal RF2 that is the amplified signal output from the power amplifier unit 211, to flow to the ground of the power amplifier unit 211.

In the power amplifier circuit 10, the current I2 that is the return current is successfully returned to the semiconductor chip 201 without necessarily flowing through the substrate 301. Consequently, a fluctuation in the reference potential of the substrate 301 caused by the current I2 is suppressed or reduced.

In the power amplifier circuit 10 according to the first embodiment, the substrate 301 further includes the power supply circuit 311 that supplies the power amplifier unit 211 with a power supply voltage, the output matching circuit 321 to which the RF signal RF4 is input from the power amplifier unit 211, the ground terminal 3415 supplied with the reference potential, and the ground unit 331 that is coupled to the ground terminal 3415. The ground unit 331 of the substrate 301 is electrically coupled to the ground terminal 231a of the semiconductor chip 201, the power supply circuit 311, and the output matching circuit 321.

The power amplifier circuit 10 may suppress a deterioration in the performance of the input circuit unit 221, the output matching circuit 321, and the power supply circuit 311 that refer to the reference potential of the ground unit 331.

In the power amplifier circuit 10, the inductance component of the circuit element 412 includes the inductance component of the wiring of the substrate 301. This enables a reduction of the size of the circuit element 412 and consequently a reduction of the size of the power amplifier circuit 10.

In the power amplifier circuit 10, the substrate 301 and the semiconductor chip 201 are coupled to each other by flip chip bonding. Thus, magnetic field coupling between the leads of the semiconductor chip 201 is successfully reduced, and a deterioration in the performance of the power amplifier circuit 10 may be suppressed by increasing the reflection coefficient for the harmonic wave components.

A second embodiment will be described. In second and subsequent embodiments, the description of matters that are common to the first embodiment and the second and subsequent embodiments will be omitted as much as possible and differences will be mainly described. In particular, substantially the same effects resulting from substantially the same configurations will not be mentioned for each of the embodiments.

Figure 2:
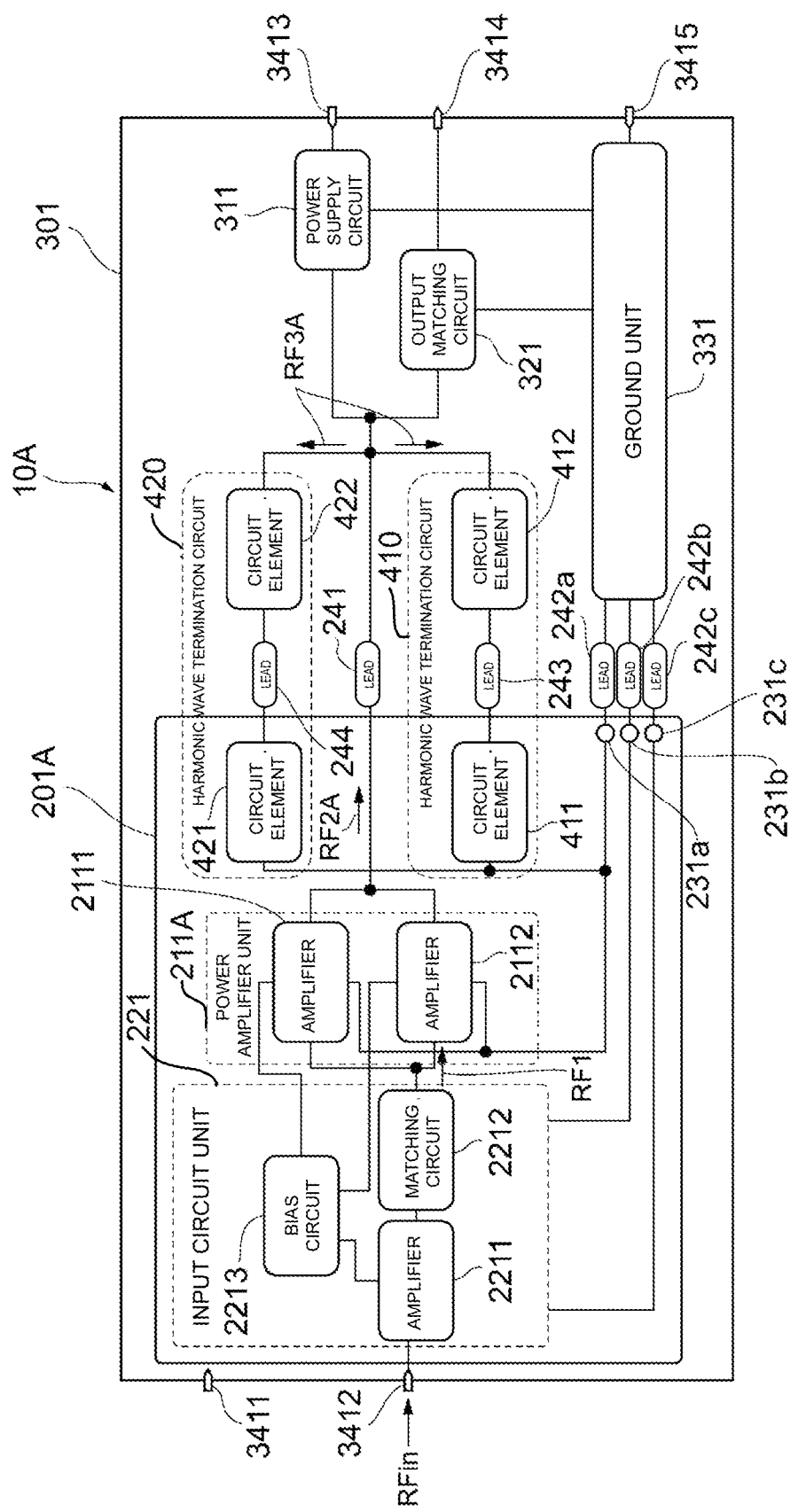
FIG. 2 is a block diagram of a power amplifier circuit according to a second embodiment of the present disclosure.

As illustrated in FIG. 2, a power amplifier circuit 10A according to the second embodiment further includes an amplifier 2112 and a harmonic wave termination circuit 420 in addition to the components of the power amplifier circuit 10 according to the first embodiment.

The amplifiers 2111 and 2112 are coupled to each other in parallel. The amplifier 2112 is supplied with a bias current or voltage from the bias circuit 2213. Similarly to the amplifier 2111, the amplifier 2112 includes a transistor.

The harmonic wave termination circuit 420 includes at least circuit elements 421 and 422. The harmonic wave termination circuits 410 and 420 are coupled to each other in parallel. The circuit element 421 is included in the semiconductor chip 201. The circuit element 422 is included in the substrate 301. Each of the circuit elements 421 and 422 is, for example, a capacitor or an inductor.

One end of the circuit element 421 is coupled to the ground terminal 231a without necessarily any portion outside the semiconductor chip 201 interposed therebetween. The other end of the circuit element 421 is coupled to the circuit element 422 with a lead 244 interposed therebetween.

The amplifiers 2111 and 2112 are coupled to the power supply circuit 311, the output matching circuit 321, and the harmonic wave termination circuits 410 and 420 with the lead 241 interposed therebetween so that a signal propagates through a portion outside a semiconductor chip 201A.

An RF signal RF2A obtained by combining outputs of the amplifiers 2111 and 2112 is output to the outside of the semiconductor chip 201 via the lead 241.

The semiconductor chip 201A and the substrate 301 include wiring that couples the amplifiers 2111 and 2112 to the harmonic wave termination circuits 410 and 420 and through which a harmonic wave component RF3A of the RF signal RF2A flows via portions outside the semiconductor chip 201A. Note that the harmonic wave component RF3A is obtained by combining harmonic wave components included in the outputs of the amplifiers 2111 and 2112.

This wiring is formed such that an average of a length of the wiring from the amplifier 2111 to the harmonic wave termination circuit 410 and a length of the wiring from the amplifier 2111 to the harmonic wave termination circuit 420 is equal or substantially equal to an average of a length of the wiring from the amplifier 2112 to the harmonic wave termination circuit 410 and a length of the wiring from the amplifier 2112 to the harmonic wave termination circuit 420.

As a result of making the average lengths of the wiring equal or substantially equal to each other, an impedance of the amplifier 2111 for the harmonic wave termination circuits 410 and 420 and an impedance of the amplifier 2112 for the harmonic wave termination circuits 410 and 420 are made equal or substantially equal to each other.

In the power amplifier circuit 10A, the harmonic wave component RF3A of the RF signal RF2A output from a power amplifier unit 211A flows into the harmonic wave termination circuits 410 and 420. Since the impedances of the wiring are made equal or substantially equal to each other, the harmonic wave component RF3A equally or substantially equally distributed to and flows into the harmonic wave termination circuits 410 and 420.

In the power amplifier circuit 10A according to the second embodiment, the power amplifier unit 211A includes the plurality of amplifiers 2111 and 2112 coupled to each other in parallel, and the semiconductor chip 201A and the substrate 301 include the plurality of harmonic wave termination circuits 410 and 420. The average wiring lengths from the respective amplifiers 2111 and 2112 are equal to one another, each of the average wiring lengths being an average of lengths of wiring that extends from a corresponding one of the plurality of amplifiers 2111 and 2112 to the plurality of harmonic wave termination circuits 410 and 420 with respective portions outside the semiconductor chip 201A interposed therebetween and through which the harmonic wave component RF3A flows.

The power amplifier circuit 10A makes the impedances of the wiring equal or substantially equal to each other. Thus, when the plurality of amplifiers 2111 and 2112 are coupled to each other in parallel, the harmonic wave is successfully terminated equally or substantially equally with the harmonic wave termination circuits 410 and 420 having the same or substantially the same configuration. Since the harmonic waves of the signals output from the amplifiers 2111 and 2112 are successfully terminated equally or substantially equally, the operation of the power amplifier circuit 10A is successfully made uniform or substantially uniform.

The power amplifier circuit 10A according to the second embodiment uses the two amplifiers 2111 and 2112 and the two harmonic wave termination circuits 410 and 420; however, the number of amplifiers and the number of harmonic wave termination circuits may be three or more. In such a case, the same or substantially the same effects as those of the second embodiment will be obtained if averages of lengths of the wiring from each of the amplifiers to the individual harmonic wave termination circuits are made equal or substantially equal among the amplifiers.

Figure 3:
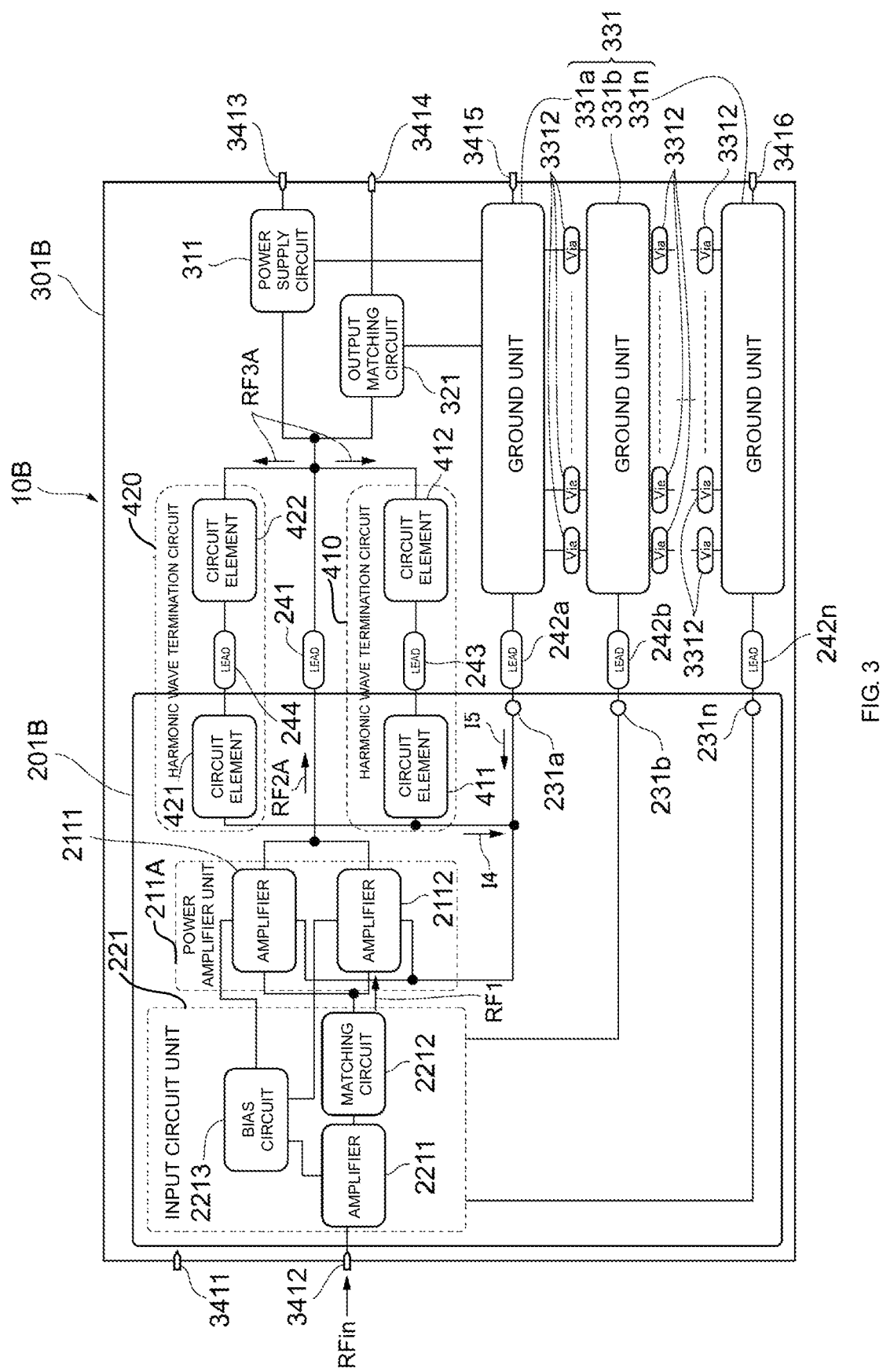
FIG. 3 is a block diagram of a power amplifier circuit according to a third embodiment of the present disclosure.

A third embodiment will be described. As illustrated in FIG. 3, a power amplifier circuit 10B according to the third embodiment includes a substrate 301B that is a multi-layer substrate.

The substrate 301B includes n layers of the ground unit 331 from a ground unit 331a to a ground unit 331n. The ground units 331a to 331n of the respective layers are coupled to each other with via electrodes 3312 interposed therebetween. The ground unit 331n is coupled to a ground terminal 3416 of the power amplifier circuit 10B. The ground unit 331n is supplied with a reference potential via the ground terminal 3416.

A semiconductor chip 201B includes n ground terminals from a ground terminal 231a to a ground terminal 231n. The semiconductor chip 201B includes n leads from a lead 242a to a lead 242n. The ground terminals 231a to 231n are coupled to the ground units 331a to 331n with the leads 242a and 242n interposed therebetween, respectively.

The ground terminal 231a is coupled to the circuit elements 411 and 421. The ground terminal 231a is coupled to a ground of the power amplifier unit 211A. The power amplifier unit 211A is supplied with the reference potential from the ground unit 331a.

The ground terminals 231b to 231n are coupled to grounds of the input circuit unit 221. The input circuit unit 221 is supplied with the reference potentials from the ground units 331b to 331n.

The power amplifier circuit 10B includes the two amplifiers 2111 and 2112 and the two harmonic wave termination circuits 410 and 420; however, the number of amplifiers and the number of harmonic wave termination circuits may be one or three or more.

When the power amplifier circuit 10B operates, a current I4 obtained by combining return currents that flow through the harmonic wave termination circuits 410 and 420 flows into the ground of the power amplifier unit 211A. A current I5 that is a return current from the power supply circuit 311 or the output matching circuit 321 flows into the ground of the power amplifier unit 211A via the ground unit 331a and the ground terminal 231a.

The return currents that flow through the ground units 331b to 331n and flow into the grounds of the input circuit unit 221 are less than those in the power amplifier circuit 10A. Thus, a fluctuation in the reference potential of the input circuit unit 221 is suppressed or reduced.

In the power amplifier circuit 10B, the semiconductor chip 201B further includes the input circuit unit 221 that supplies the power amplifier unit 211A with an RF signal input from outside of the power amplifier circuit 10B, and the ground terminal 231b to which the ground of the input circuit unit 221 is coupled. The substrate 301B is a multi-layer substrate. The ground unit 331 of the substrate 301B includes the ground unit 331a disposed on or in a first layer of the substrate 301B and the ground unit 331b disposed on or in a second layer of the substrate 301B. The ground of the power amplifier unit 211A is electrically coupled to the ground unit 331a with the ground terminal 231a interposed therebetween, and to, from the ground unit 331a, the ground of the input circuit unit 221 with the ground unit 331b and the ground terminal 231b interposed between the ground unit 331a and the ground of the input circuit unit 221.

As a result of forming the plurality of layers of the ground unit 331, the ground unit 331b where a fluctuation in the potential is less likely to be caused by the return current is successfully provided. By coupling the input circuit unit 221 to the ground unit 331b where the fluctuation in the potential is less likely to be caused, an influence of the fluctuation in the reference potential of the circuit is successfully suppressed or reduced.

Note that the embodiments described above are provided for making it easier to understand the present disclosure and are not to be construed as limiting the present disclosure. The present disclosure can be modified/improved without necessarily departing from the gist thereof, and the present disclosure includes equivalents thereof. That is, configurations obtained by appropriately modifying the designs of the embodiments by those skilled in the art are also within the scope of the present disclosure as long as the configurations include the features of the present disclosure. For example, the components in the embodiments described above and the arrangement, materials, conditions, shapes, sizes, and the like thereof are not limited to those described by way of examples and can be appropriately modified. In addition, the embodiments are merely examples, and it is needless to say that the configuration of one of the embodiments can be partly replaced with or combined with the configuration of the different embodiment. Such modifications are also within the scope of the present disclosure as long as the modifications include the features of the present disclosure. In the description, the term "to couple electrically", "electrically-coupling", or "electrically-coupled" is defined as "to connect", "connecting", or "connected", whether directly or indirectly through intervening component, and is not necessarily limited to physical connections.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
a substrate; and
a semiconductor chip disposed on or above the substrate, wherein the semiconductor chip comprises:
    a power amplifier configured to amplify a radio frequency signal and to output an amplified signal,
    a first ground terminal, a ground of the power amplifier being coupled to the first ground terminal,
    a first circuit element having a first end and a second end, the first end of the first circuit element being electrically coupled to the first ground terminal without any portion outside the semiconductor chip interposed between the first end of the first circuit element and the first ground terminal, and
    a lead connecting the first circuit element to a second circuit element,
wherein the substrate comprises:
    the second circuit element having a first end and a second end, the first end of the second circuit element being electrically coupled to an output of the power amplifier, the second end of the second circuit element being electrically coupled to the lead,
wherein the first circuit element and the second circuit element are circuit elements of a harmonic wave termination circuit,
wherein the harmonic wave termination circuit is configured to reflect, to the power amplifier, a harmonic wave component of the amplified signal output from the power amplifier,
wherein the power amplifier comprises a plurality of amplifiers coupled to each other in parallel,
wherein the semiconductor chip and the substrate comprise a plurality of the harmonic wave termination circuits corresponding to each of the plurality of amplifiers,
wherein an average wiring length from each of the amplifiers is an average of lengths of wiring that extend from a corresponding one of the plurality of amplifiers to the plurality of harmonic wave termination and through which the harmonic wave component flows, and
wherein the average wiring length is equal for each of the amplifiers.

2. The power amplifier circuit according to claim 1, wherein the substrate further comprises:
    a power supply circuit configured to supply the power amplifier with a power supply voltage,
    an output matching circuit, the amplified signal output from the power amplifier being input to the output matching circuit,
    a ground terminal supplied with a reference potential, and
    a ground portion that is coupled to the ground terminal, and
wherein the ground portion of the substrate is electrically coupled to the first ground terminal of the semiconductor chip, the power supply circuit, and the output matching circuit.

3. A power amplifier circuit comprising: a substrate; and a semiconductor chip disposed on or above the substrate, wherein the semiconductor chip comprises:
    a power amplifier configured to amplify a radio frequency signal and to output an amplified signal,
    a first ground terminal, a ground of the power amplifier being coupled to the first ground terminal,
    a first circuit element having a first end and a second end, the first end of the first circuit element being electrically coupled to the first ground terminal without any portion outside the semiconductor chip interposed between the first end of the first circuit element and the first ground terminal,
    a lead connecting the first circuit element to a second circuit element, and
    an input circuit configured to supply the power amplifier with the radio frequency signal, the radio frequency signal being input from outside of the power amplifier circuit, and
    a second ground terminal, a ground of the input circuit being coupled to the second ground terminal,
wherein the substrate comprises:
    the second circuit element having a first end and a second end, the first end of the second circuit element being electrically coupled to an output of the power amplifier, the second end of the second circuit element being electrically coupled to the lead,
    a power supply circuit configured to supply the power amplifier with a power supply voltage,
    an output matching circuit, the amplified signal output from the power amplifier being input to the output matching circuit,
    a ground terminal supplied with a reference potential, and
    a ground portion that is coupled to the ground terminal,
wherein the ground portion of the substrate is electrically coupled to the first ground terminal of the semiconductor chip, the power supply circuit, and the output matching circuit,
wherein the first circuit element and the second circuit element are circuit elements of a harmonic wave termination circuit,
wherein the harmonic wave termination circuit is configured to reflect, to the power amplifier, a harmonic wave component of the amplified signal output from the power amplifier,
wherein the substrate is a multi-layer substrate,
wherein the ground portion of the substrate comprises:
    a first ground portion disposed on or in a first layer of the substrate, and a second ground portion disposed on or in a second layer of the substrate, and wherein the ground of the power amplifier is electrically coupled to:

the first ground portion, the first ground terminal being interposed between the first ground portion and the ground of the power amplifier, and the ground of the input circuit, the second ground portion and the second ground terminal being interposed between the first ground portion and the ground of the input circuit.

4. The power amplifier circuit according to claim 2, wherein the semiconductor chip further comprises:

an input circuit configured to supply the power amplifier with the radio frequency signal, the radio frequency signal being input from outside of the power amplifier circuit, and a second ground terminal, a ground of the input circuit being coupled to the second ground terminal, wherein the substrate is a multi-layer substrate, wherein the ground portion of the substrate comprises:

a first ground portion disposed on or in a first layer of the substrate, and a second ground portion disposed on or in a second layer of the substrate, and wherein the ground of the power amplifier is electrically coupled to:

the first ground portion, the first ground terminal being interposed between the first ground portion and the ground of the power amplifier, and the ground of the input circuit, the second ground portion and the second ground terminal being interposed between the first ground portion and the ground of the input circuit.

5. The power amplifier circuit according to claim 2, wherein an inductance component of the second circuit element includes an inductance component of wiring of the substrate.

6. The power amplifier circuit according to claim 1, wherein an inductance component of the second circuit element includes an inductance component of wiring of the substrate.

7. The power amplifier circuit according to claim 3, wherein an inductance component of the second circuit element includes an inductance component of wiring of the substrate.

8. The power amplifier circuit according to claim 2, wherein the substrate and the semiconductor chip are coupled to each other by flip chip bonding.

9. The power amplifier circuit according to claim 1, wherein the substrate and the semiconductor chip are coupled to each other by flip chip bonding.

10. The power amplifier circuit according to claim 3, wherein the substrate and the semiconductor chip are coupled to each other by flip chip bonding.

11. The power amplifier circuit according to claim 5, wherein the substrate and the semiconductor chip are coupled to each other by flip chip bonding.

12. A power amplifier circuit comprising: a substrate; and a semiconductor chip disposed on or above the substrate, wherein the semiconductor chip comprises:

a power amplifier configured to amplify a radio frequency signal and to output an amplified signal, a first ground terminal, a ground of the power amplifier being coupled to the first ground terminal, a first circuit element having a first end and a second end, the first end of the first circuit element being electrically coupled to the first ground terminal without any portion outside the semiconductor chip interposed between the first end of the first circuit element and the first ground terminal, a lead connecting the first circuit element to a second circuit element, an input circuit configured to supply the power amplifier with the radio frequency signal, the radio frequency signal being input from outside of the power amplifier circuit, and a second ground terminal, a ground of the input circuit being coupled to the second ground terminal, wherein the substrate comprises:

the second circuit element having a first end and a second end, the first end of the second circuit element being electrically coupled to an output of the power amplifier, the second end of the second circuit element being electrically coupled to the lead, wherein the first circuit element and the second circuit element are circuit elements of a harmonic wave termination circuit, wherein the harmonic wave termination circuit is configured to reflect, to the power amplifier, a harmonic wave component of the amplified signal output from the power amplifier, and wherein the input circuit comprises an amplifier, a matching circuit, and/or a bias circuit.

13. The power amplifier circuit according to claim 12, wherein an inductance component of the second circuit element includes an inductance component of wiring of the substrate.

14. The power amplifier circuit according to claim 12, wherein the substrate and the semiconductor chip are coupled to each other by flip chip bonding.

15. The power amplifier circuit according to claim 12, wherein the input circuit comprises the amplifier and the matching circuit.

16. The power amplifier circuit according to claim 15, wherein the input circuit further comprises the bias circuit, and wherein the bias circuit is connected to the amplifier of the input circuit and connected to the power amplifier.

* * * * *